United States Patent
Chinone et al.

[11] Patent Number: 5,854,492
[45] Date of Patent: Dec. 29, 1998

[54] SUPERCONDUCTING QUANTUM INTERFERENCE DEVICE FLUXMETER AND NONDESTRUCTIVE INSPECTION APPARATUS

[75] Inventors: Kazuo Chinone; Toshimitsu Morooka; Satoshi Nakayama; Akikazu Odawara, all of Chiba, Japan

[73] Assignee: Seiko Instruments Inc., Japan

[21] Appl. No.: 739,307

[22] Filed: Oct. 29, 1996

[30] Foreign Application Priority Data

Nov. 22, 1995 [JP] Japan .................................. 7-304782

[51] Int. Cl.$^6$ .................... H01L 29/06; H01L 31/0256; H01L 39/22; G01R 33/035
[52] U.S. Cl. .................. 257/31; 257/36; 324/228; 324/248; 505/160; 505/162; 505/726; 505/727; 505/845; 505/846
[58] Field of Search .................... 257/31, 34, 36; 324/228, 248; 505/160, 162, 702, 726, 727, 845, 846

[56] References Cited

U.S. PATENT DOCUMENTS

| | | | |
|---|---|---|---|
| 4,588,947 | 5/1986 | Ketchen | 324/201 |
| 4,689,559 | 8/1987 | Hastings et al. | 324/248 |
| 5,173,620 | 12/1992 | Fujimaki et al. | 307/306 |
| 5,173,660 | 12/1992 | Marsden | 324/248 |
| 5,218,297 | 6/1993 | Nakane et al. | 324/248 |
| 5,293,119 | 3/1994 | Podney | 324/242 |
| 5,306,521 | 4/1994 | Shimizu et al. | 427/62 |
| 5,319,307 | 6/1994 | Simmonds | 324/248 |
| 5,438,036 | 8/1995 | Matsuura et al. | 505/162 |
| 5,548,130 | 8/1996 | Shimizu et al. | 257/31 |
| 5,596,273 | 1/1997 | Yabe et al. | 324/248 |

FOREIGN PATENT DOCUMENTS

| | | |
|---|---|---|
| 399499A2 | 11/1990 | European Pat. Off. . |
| 591641A1 | 4/1994 | European Pat. Off. . |
| 5-323003 | 12/1993 | Japan . |

OTHER PUBLICATIONS

IEEE Transactions on Applied Superconductivity, vol. 3, No. 1, Part 04, Mar. 1, 1993, pp. 1795–1799, M. Ketchen et al., "Octagonal Washer dc Squids and Integrated Susceptometers Fabricated in a Planarized Sub–Micrometer Nb–Alo$_x$–Nb Technology".

*Primary Examiner*—Mahshid D. Saadat
*Assistant Examiner*—Allan R. Wilson
*Attorney, Agent, or Firm*—Adams & Wilks

[57] ABSTRACT

A nondestructive inspection apparatus having a SQUID is made with compact configuration and is capable of detecting a metallic or non-metallic metal for defects, corrosion, and the like, by forming the SQUID and a magnetic field applying coil on the same substrate. The SQUID comprises two Josephson junctions, a washer coil connected to the Josephson junctions to form a superconducting loop, shunt resistors, a damping resistor, and a feedback modulation coil, all of which are formed from a superconducting thin film on a supporting substrate. A magnetic field applying coil is formed on the same supporting substrate with a superconducting thin film or a normal conducting metal thin film. The magnetic field applying coil, which generally has plural turns around the SQUID, applies a dc or ac magnetic field to a sample. The change in magnetic field caused by a defect in the sample is detected by the washer coil, and the position and size of the defect may thus be determined. Since the magnetic field applying coil is integrated on the same substrate as that on which the SQUID is formed, the apparatus may be made compact.

16 Claims, 4 Drawing Sheets

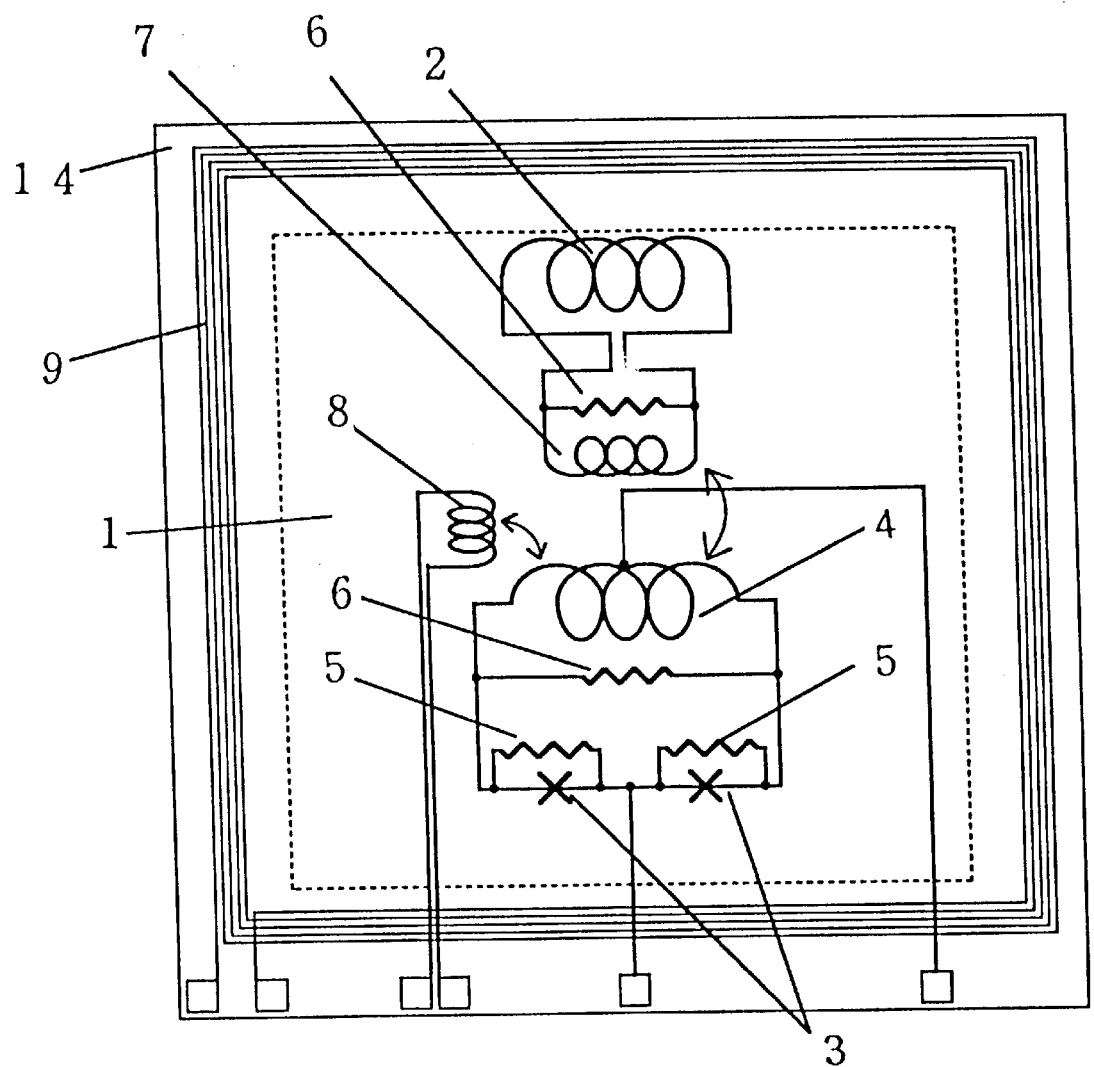
F I G. 3

SUPERCONDUCTING QUANTUM INTERFERENCE DEVICE FLUXMETER AND NONDESTRUCTIVE INSPECTION APPARATUS

BACKGROUND OF THE INVENTION

The present invention relates to a superconducting quantum interference device (hereinafter referred to as SQUID) fluxmeter used for nondestructive inspection to inspect for defects, corrosion, etc. of metal in a nondestructive and non-contact mode, and a nondestructive inspection apparatus employing the SQUID fluxmeter.

FIG. 4 is a schematic view of a nondestructive inspection apparatus employing a conventional SQUID fluxmeter. A SQUID 1, a pickup coil 2 superconductively connected to the SQUID 1, and a magnetic field applying coil 9 are held in a cooling vessel 12, and a drive circuit 13 for the SQUID 1 is disposed above the cooling vessel 12. The pickup coil 2 and the magnetic field applying coil 9 are arranged so as to face a sample 10. The sample 10 is placed on a sample scanning device 11.

The sample 10 to be inspected is scanned by the sample scanning device 11, and a dc or ac magnetic field for inspection is applied by the magnetic field applying coil 9 according to the material of the sample 10. A responsive magnetic signal generated from the sample 10 by the magnetic field for inspection is detected by the pickup coil 2. A detected magnetic flux detected by the pickup coil 2 is transmitted to the SQUID 1. The SQUID 1 is operated as a fluxmeter by the drive circuit 13.

For a sample 10 made of a magnetic material, defective and non-defective portions have a different magnetic permeability. When a dc magnetic field is applied to the sample 10 by the magnetic field applying coil 9, the applied magnetic field is distorted at the defective portion. The distortion of the magnetic field is detected by the SQUID 1 through the pickup coil 2, by which the position and size of the defect can be inspected.

For a sample 10 made of a non-magnetic conductive material, an ac magnetic field is applied to the sample 10 by the magnetic field applying coil 9. An eddy current is produced in the sample by the applied ac magnetic field, and the eddy current becomes turbulent at a defective portion of the sample. The turbulence of the eddy current is detected by the pickup coil 2 and the SQUID 1, by which the position of the defect is detected.

In a conventional inspection apparatus employing a SQUID fluxmeter, a large magnetic field applying coil is provided apart from the SQUID. With this configuration, a large space is required for installing the magnetic field applying coil, so that the scale of the apparatus increases. Therefore, when the sample to be inspected is small, or when the resolution at a planar position is required to be high, it is difficult to provide inspection means.

SUMMARY OF THE INVENTION

It is an object of the present invention to provide a superconducting quantum interference device fluxmeter and a nondestructive inspection apparatus, which have a compact system configuration, by integrating a magnetic field applying coil on the same substrate as that on which a SQUID is formed.

For the SQUID fluxmeter thus configured, the magnetic field applying coil need not be constructed outside, so that an increase in the scale of the apparatus can be restrained, providing a simple construction. Therefore, the SQUID fluxmeter can be applied even when the sample to be inspected is small, or when a high planar resolution is required.

When a nondestructive inspection is performed using the inventive SQUID fluxmeter, a magnetic field can easily be applied to the sample to be inspected.

Also, before the nondestructive inspection, it is neccessary to know a sensitivity of the SQUID fluxmeter. The magnetic field applying coil can be also used for the sensitivity calibration of the SQUID. The sensitivity calibration of the SQUID can be performed by generating a magnetic field of a predetermined power with the magnetic field applying coil without a sample and by measuring an output signal of the SQUID fluxmeter.

The magnetic field applying coil can be used as a heat-flash heater by making it of a normal conducting metal thin film. When a superconducting material is cooled at cryogenic temperature under a magnetic field, the magnetic field is taken in by the superconducting material, that is a phenomenon called magnetic flux trap. The magnetic flux trap deteriorates characteristics of the SQUID. In order to remove the trapped flux from the superconducting material, the superconducting characteristic of the material is changed into a normalconducting characteristic by heating and after that, the characteristic of the material is changed into a superconducting characteristic again, that is a phenomenon called heat-flash. The magnetic field applying coil made with a thin film of normalconducting material can be used as a heat-flash heater to generate heat. Therefore, the magnetic flux trapped by the SQUID is easily released.

BRIEF DESCRIPTION OF THE DRAWINGS

FIG. 3 is an equivalent circuit diagram of a SQUID fluxmeter, showing a second embodiment of the present invention.

DETAILED DESCRIPTION OF THE PREFERRED EMBODIMENTS

According to the present invention, a superconducting quantum interference device fluxmeter comprises a superconducting quantum interference device having a pair of Josephson junctions formed on a superconducting thin film on a substrate, a washer coil connected to the Josephson junctions to form a superconducting loop, and a feedback modulation coil magnetically coupled with the washer coil; a drive circut for operating the superconducting quantum interference device as a fluxmeter; and a magnetic field applying coil formed on the same substrate to apply a predetermined magnetic field to a sample to be inspected.

The magnetic field applying coil may be formed of a superconducting thin film or may be formed of a normal conducting metal thin film on the aforementioned same substrate.

Further, a pickup coil for detecting magnetic field and an input coil magnetically coupled with the washer coil may be integrated on the same substrate as that on which the superconducting quantum interference device and the magnetic field applying coil are formed.

There can also be provided a nondestructive inspection apparatus comprising the aforesaid superconducting quantum interference device fluxmeter, sample scanning means for scanning the sample to be inspected, and means for judging the position of a defect in the sample to be inspected based on the detection result for the magnetic field applied to the sample to be inspected.

Since the SQUID fluxmeter thus configured has the magnetic field applying coil integrated on the same substrate as the SQUID substrate, when the nondestructive inspection apparatus employing the SQUID fluxmeter is configured, an increase in the scale of the apparatus can be restrained, providing a simple construction. Thereupon, the SQUID fluxmeter can be applied even when the sample to be inspected is small, or when a high planar resolution is required.

Embodiments of the present invention will be described with reference to, the drawings.

Figure 1:
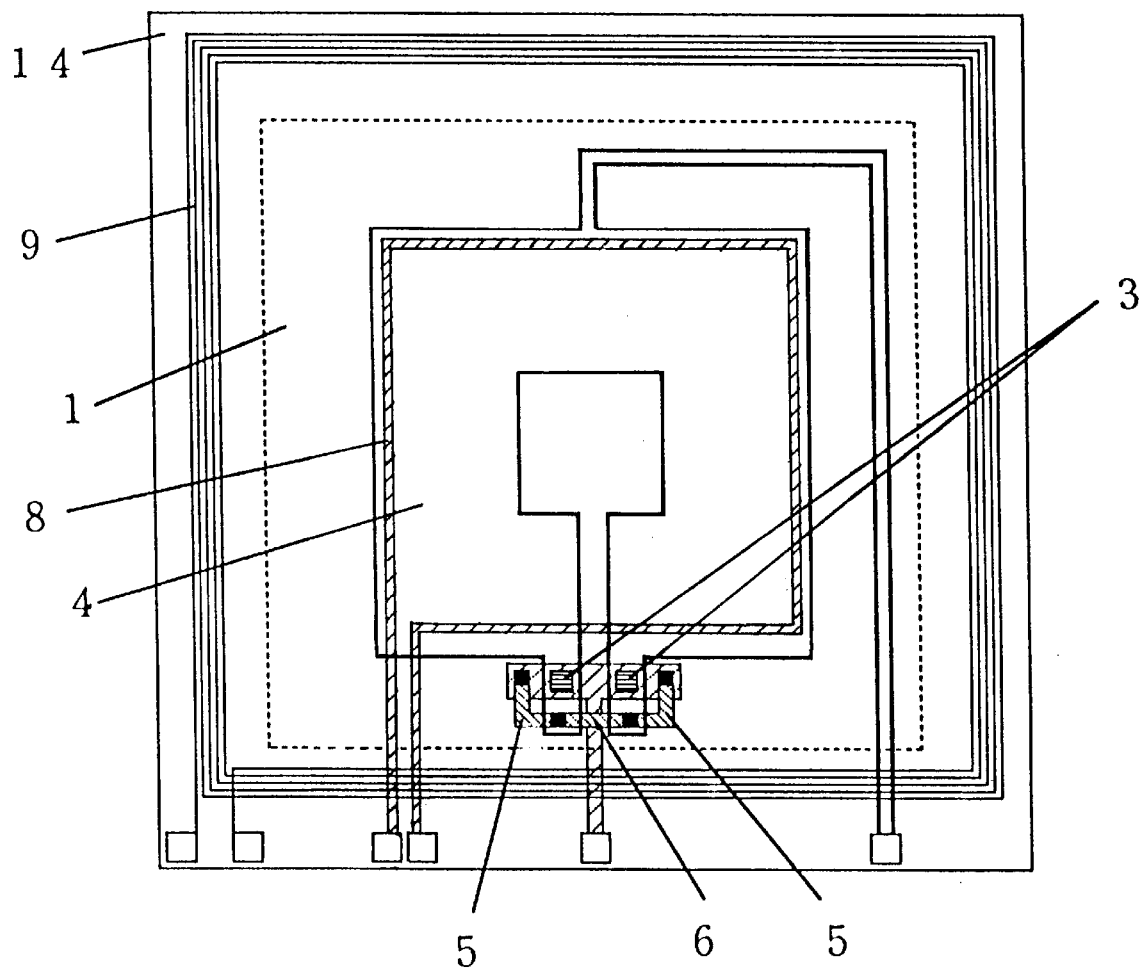
FIG. 1 is a schematic view of a SQUID fluxmeter, showing a first embodiment of the present invention.

FIG. 1 is a plan view of a SQUID fluxmeter, showing a first embodiment of the present invention. On a substrate 14, two Josephson junctions 3, a washer coil 4 forming a superconducting loop with the Josephson junctions 3, shunt resistors 5 connected in parallel with the Josephson junctions 3 to eliminate hysteresis in the current-voltage characteristics, and a damping resistor 6 connected in parallel to inhibit an unnecessary resonance at the washer coil 4 are integrated. Further, a feedback modulation coil 8 is magnetically coupled with the washer coil 4 to perform driving using a FLL (Flux Locked Loop) circuit. A SQUID 1 is constructed in such a manner.

In order to apply a dc or ac magnetic field to a sample, a plurality of turns of a magnetic field applying coil 9 are wound around the SQUID 1. The magnetic field applying coil 9 is integrated on the same substrate 14 as that for the SQUID 1. The material of the magnetic field applying coil 9 may be a superconducting thin film or may be a normal conducting metal thin film. In this embodiment, a plurality of turns of the magnetic field applying coil 9 are wound. The number of turns, which depends on the value of the current carried in the magnetic field applying coil and the conductivity of a sample to be inspected, may be single or plural.

When a SQUID fluxmeter in accordance with the present invention is applied to a nondestructive inspection, a dc or ac magnetic field is applied to the sample by the magnetic field applying coil 9 according to the material of the sample, and a change in magnetic field produced by a defective portion of the sample is detected directly by the washer coil 4, by which the position and size of the defect are inspected.

For a sample made of a magnetic material, a property that the defective and non-defective portions have a different magnetic permeability is used, and a dc magnetic field is applied to the sample by the magnetic field applying coil 9. Since the applied dc magnetic field is distorted at the defective portion, the distortion of magnetic field is detected by the washer coil 4.

For a sample made of a non-magnetic conductive material, an ac magnetic field is applied to the sample by the magnetic field applying coil. An eddy current is produced in the sample by the applied ac magnetic field, and the eddy current is made turbulent at the defective portion of the sample. The turbulence of the eddy current is detected as a turbulence of magnetic field by the washer coil 4.

Figure 2:
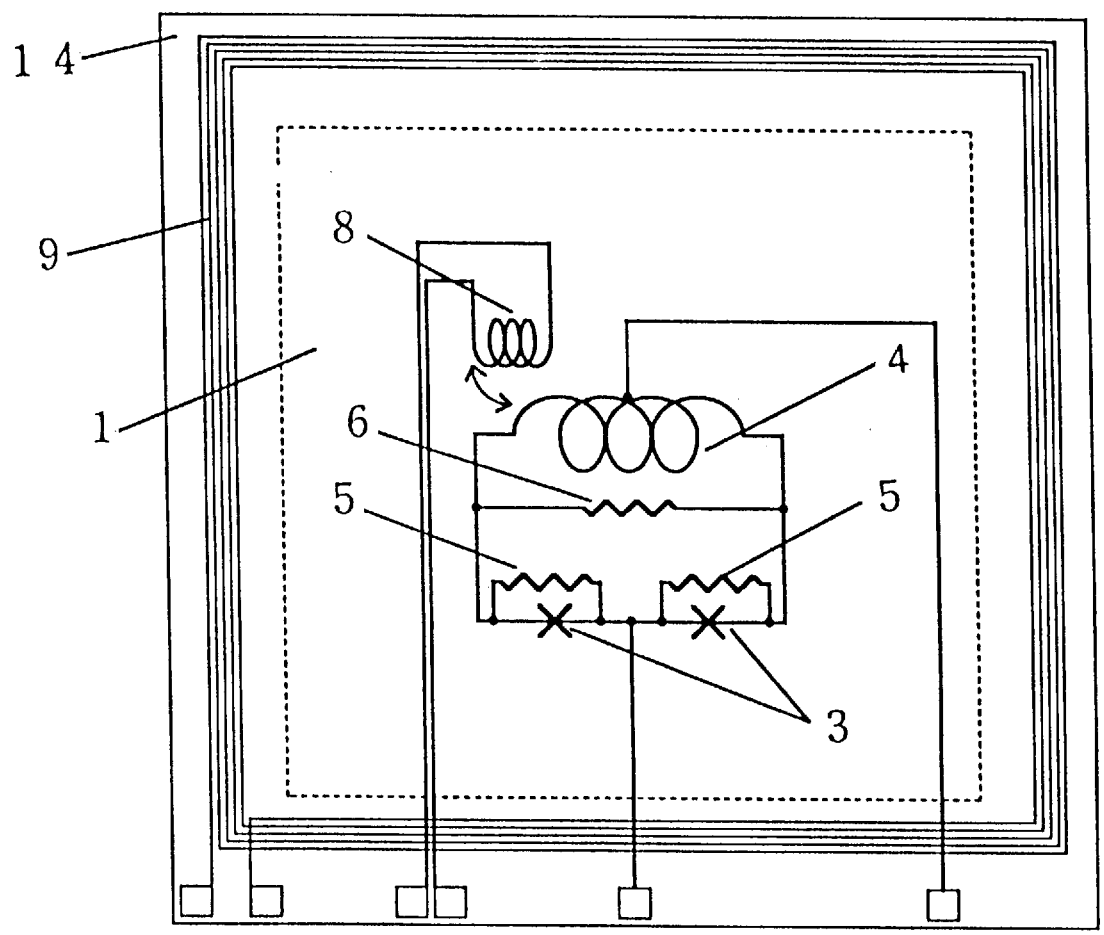
FIG. 2 is a view showing a SQUID in accordance with the first embodiment of the present invention, which is expressed by an equivalent circuit.
Figure 4:
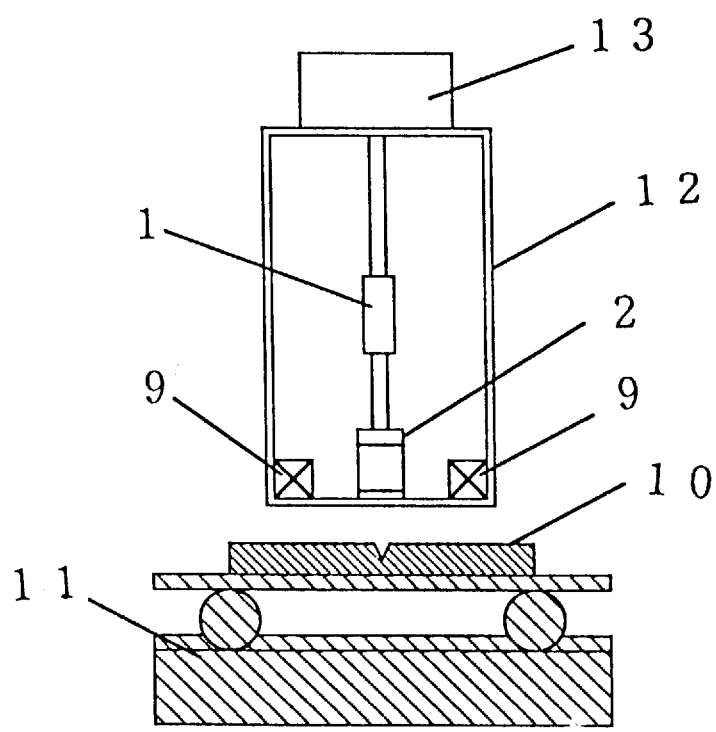
FIG. 4 is a schematic view of a nondestructive inspection apparatus employing a conventional SQUID flux meter.

FIG. 2 shows the portion of the SQUID 1 of the SQUID fluxmeter shown in FIG. 1, which is expressed by an equivalent circuit. In this figure, the connecting relation between the Josephson junctions 3, washer coil 4, shunt resistors 5, damping resistor 6, and feedback modulation coil 8 is shown with circuit symbols, corresponding to the schematic view of FIG. 1.

FIG. 3 is a plan view of a SQUID fluxmeter, showing a second embodiment of the present invention. In FIG. 3 as well, the SQUID 1 is expressed by an equivalent circuit for simplicity. In the aforementioned first embodiment, the change in magnetic field of the sample is detected directly by the washer coil 4, while in this embodiment, a special-purpose pickup coil is provided to detect the change in magnetic field of the sample, and an input coil is provided to input the change in magnetic field detected by the pickup coil to the SQUID 1.

The magnetic field applying coil 9 wound plural turns is integrated around the SQUID 1. The planar type pickup coil 2, which is integrated on the same substrate 14 as that for the SQUID 1, detects the change in magnetic field produced by a defect in the sample. The input coil 7, which is magnetically coupled with the washer coil 4, transmits the magnetic field detected by the planar type pickup coil 2 to the washer coil 4. The shape of the planar type pickup coil 2 may be of a magnet meter type or a differential type.

The magnetic field applying coil 9 is not only used for applying a magnetic field to the sample to be inspected in nondestructive inspections but also can be used as a coil for sensitivity calibration in which a magnetic field is applied to calibrate the sensitivity of the SQUID.

The magnetic field applying coil 9 may be made of a superconducting thin film. However, it also can be used as a heat-flash heater for releasing magnetic flux trap which reduces the property of the SQUID by making it of a normal conducting metal thin film.

As described above, according to the present invention, since the magnetic field applying coil and the SQUID are integrated on the same substrate, for the inspection apparatus employing the SQUID, the magnetic field applying coil need not be constructed outside, so that an increase in the scale of the apparatus can be restrained, providing a simple construction.

What is claimed is:

1. A superconducting quantum interference device fluxmeter comprising: a supporting substrate; a superconducting quantum interference device having at least one Josephson junction formed on the supporting substrate, a washer coil connected to the at least one Josephson junction to form a superconducting loop, and a feedback modulation coil magnetically coupled with the washer coil; a pickup coil for detecting a magnetic field; an input coil coupled to the pickup coil and magnetically coupled with the washer coil, the input coil being formed on the supporting substrate; and a magnetic field applying coil formed on the supporting substrate for applying a predetermined magnetic field to a sample to be inspected.

2. A superconducting quantum interference device fluxmeter according to claim 1; wherein the magnetic field applying coil is formed of a superconducting thin film on the supporting substrate.

3. A superconducting quantum interference device fluxmeter according to claim 1; wherein the magnetic field applying coil is formed of a normal conducting metal thin film on the supporting substrate.

4. A nondestructive inspection apparatus comprising: a superconducting quantum interference device having at least one Josephson junction formed on a supporting substrate, a washer coil connected to the at least one Josephson junction to form a superconducting loop, and a feedback modulation coil magnetically coupled with the washer coil a pickup coil for detecting a magnetic field; an input coil coupled to the pickup coil and the washer coil, the input coil being formed on the supporting substrate; a magnetic field applying coil formed on the supporting substrate for applying a predetermined magnetic field to a sample to be inspected; sample scanning means for supporting and moving the sample relative to the superconducting quantum interference device to permit detection by the superconducting quantum interference device of a magnetic field reflected from the sample in response to application of the predetermined magnetic field as the sample is moved; and means for determining the existence and position of a defect in the sample based on a result of the detection.

5. A superconducting quantum interference device fluxmeter according to claim 1; wherein each of the at least one Josephson junction, the washer coil, and the feedback modulation coil is formed of a superconducting thin film layer on the supporting substrate.

6. A superconducting quantum interference device fluxmeter according to claim 1; wherein the magnetic field applying coil is formed of a superconducting thin film layer on the supporting substrate.

7. A superconducting quantum interference device fluxmeter according to claim 1; wherein the magnetic field applying coil is formed of a non-superconducting metallic thin film effective to generate sufficient heat to release a magnetic flux trapped in the superconducting quantum interference device.

8. A nondestructive inspection apparatus according to claim 4; wherein the magnetic field applying coil is formed of a superconducting thin film on the supporting substrate.

9. A nondestructive inspection apparatus according to claim 4; wherein the magnetic field applying coil is formed of a normal conducting metal thin film on the supporting substrate.

10. A nondestructive inspection apparatus according to claim 4; wherein each of the at least one Josephson junction, the washer coil, and the feedback modulation coil is formed of a superconducting thin film layer on the supporting substrate.

11. A nondestructive inspection apparatus according to claim 4; wherein the magnetic field applying coil is formed of a non-superconducting metallic thin film effective to generate sufficient heat to release a magnetic flux trapped in the superconducting quantum interference device.

12. A superconducting quantum interference device comprising: a planar support substrate; a pair of Josephson junctions formed on the planar support substrate; a washer coil formed on the planar support substrate and connected to the pair of Josephson junctions to form a superconducting loop therewith; a feedback modulation coil formed on the planar support substrate and coupled to the washer coil; a pickup coil for detecting a magnetic field; an input coil coupled to the pickup coil and the washer coil, the input coil being integrated on the same support substrate as that on which the pair of Josephson functions, the washer coil, and the feedback modulation coil are formed; and a magnetic field generating coil also formed on the planar support substrate for generating a magnetic field in response to an electrical input signal.

13. A superconducting quantum interference device according to claim 12; wherein the magnetic field generating coil is formed of a superconducting thin film on the planar support substrate.

14. A superconducting quantum interference device according to claim 12; wherein the magnetic field applying coil is formed of a non-superconducting metal thin film on the planar support substrate.

15. A superconducting quantum interference device according to claim 14; wherein each of the at least one Josephson junction, the washer coil, the feedback modulation coil, and the magnetic field applying coil comprises a superconducting thin film layer deposited on the supporting substrate.

16. A superconducting quantum interference device according to claim 12; wherein the magnetic field applying coil is formed of a non-superconducting metallic thin film effective to generate sufficient heat to release a magnetic flux trapped in the superconducting quantum interference device.

* * * * *